United States Patent
Wang

(10) Patent No.: US 7,623,078 B2
(45) Date of Patent: Nov. 24, 2009

(54) ANTENNA FOR PORTABLE ELECTRONIC DEVICE WIRELESS COMMUNICATIONS ADAPTER

(75) Inventor: Shu-Li Wang, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 551 days.

(21) Appl. No.: 11/639,905

(22) Filed: Dec. 15, 2006

(65) Prior Publication Data

US 2008/0143611 A1    Jun. 19, 2008

(51) Int. Cl.
  *H01Q 1/24* (2006.01)
  *H01Q 1/52* (2006.01)
  *H01Q 1/50* (2006.01)
(52) U.S. Cl. .................. 343/702; 343/841; 343/906
(58) Field of Classification Search .......... 343/700 MS, 343/702, 841, 895, 906
See application file for complete search history.

(56) References Cited

U.S. PATENT DOCUMENTS

| | | | |
|---|---|---|---|
| 5,680,144 A | 10/1997 | Sanad | |
| 6,034,638 A | 3/2000 | Thiel et al. | |
| 6,114,996 A | 9/2000 | Nghiem | |
| 6,285,327 B1 | 9/2001 | See | |
| 6,552,686 B2 | 4/2003 | Ollikainen et al. | |
| 6,603,430 B1 | 8/2003 | Hill | |
| 6,819,289 B2 | 11/2004 | Kim et al. | |
| 7,441,266 B2 * | 10/2008 | Kurian et al. | ............ 726/9 |
| 2006/0116166 A1 * | 6/2006 | Hibino | ............ 455/557 |
| 2007/0058031 A1 * | 3/2007 | Aizawa | ............ 348/14.01 |
| 2007/0066307 A1 * | 3/2007 | Brown et al. | ............ 455/445 |

OTHER PUBLICATIONS

H. Nakano et al. "Low-profile inverted-F antenna with parasitic elements on an infinite ground plane", IEE Proc.-Microw. Antennas Propag., vol. 145, No. 4, Aug. 1998, pp. 321-325.
H. Kim et al. "Surface-Mounted Chip Dielectric Ceramic Antenna for PCS Phone", (c) 2000 IEEE, pp. 582-585.
"Helical Chip Antenna Application Notes", Panasonic Communications Miyazaki Co., Ltd., Apr. 28, 2005.
R. Vaughan "Switched Parasitic Elements for Antenna Diversity", IEEE Transactions on Antennas and Propagation, vol. 47, No. 2, Feb. 1999 pp. 399-405.

* cited by examiner

*Primary Examiner*—Shih-Chao Chen
(74) *Attorney, Agent, or Firm*—Treyz Law Group; G. Victor Treyz

(57) ABSTRACT

Antennas are provided for portable electronic devices. A portable electronic device may have a port that receives a wireless communications adapter. The adapter may be used to provide wireless functionality for the portable electronic device. The adapter may contain a chip antenna that serves as an antenna resonating element. A printed circuit board within the adapter may contain conductor that has been patterned to form a ground plane for the antenna. The portable electronic device may have a conductive structure such as a housing portion. The conductive structure of the portable electronic device serves as a parasitic antenna element that improves antenna efficiency. The portable electronic device may be a handheld electronic device with music player functionality that communicates with a compact portable wireless device in a piece of sports equipment.

20 Claims, 7 Drawing Sheets ated components for a wireless communications adapter in
ANTENNA FOR PORTABLE ELECTRONIC DEVICE WIRELESS COMMUNICATIONS ADAPTER

BACKGROUND

This invention relates generally to antennas, and more particularly, to antennas in wireless communications adapters for portable electronic devices.

As integrated circuit technology advances, it is becoming feasible to construct portable wireless devices with small form factors. Examples of portable wireless devices include mobile telephones, wireless headsets, digital cameras with wireless capabilities, remote controls, wristwatch-type devices, music players with wireless functions, and handheld computers. Devices such as these are often small enough to be held in the hand and may sometimes be referred to as handheld electronic devices. Larger portable wireless devices include laptop computers.

Portable electronic devices sometimes use antennas to transmit and receive radio-frequency signals. For example, handheld computers often contain short-range antennas for handling wireless connections with wireless access points. Other portable electronic devices have no built-in wireless communications capabilities or have only limited wireless functions.

In situations in which a portable electronic device does not have sufficient built-in wireless capabilities, a wireless communications adapter may be used to supply the portable electronic device with wireless communications capabilities.

It is generally desirable for an antenna in a wireless communications adapter for a portable electronic wireless device to exhibit a high efficiency. Antennas with high efficiencies are less likely to consume excessive power than inefficient antennas and are therefore able to operate using smaller power supplies. Large bandwidths are also sometimes desired. At the same time, it is generally desirable to make wireless communications adapters as small as reasonably possible. To a large extent, these requirements compete with each other. Conventional antenna arrangements that are small tend not to be efficient and have small bandwidths, whereas efficient wideband antennas tend to take up a fairly large volume.

It would therefore be desirable to be able to provide improved antennas for wireless communications adapters for portable electronic devices.

SUMMARY

In accordance with the present invention, a portable electronic device and a wireless communications adapter for the portable electronic device are provided. The portable electronic device may be a handheld device with music player functionality or any other suitable device. The portable electronic device may have a multipin connector that mates with a matching multipin connector on the wireless communications adapter.

The wireless communications adapter has an antenna that is used to handle wireless radio-frequency signals for the portable electronic device. Processing circuitry in the portable electronic device is used to generate data to be transmitted and is used to consume wirelessly received data. The processing circuitry communicates with transceiver circuitry in the wireless communications adapter using signal and data pins in the matching multipin connectors.

The wireless communications adapter may have a printed circuit board. One or more conductive layers on the printed circuit board may be used to form a ground plane for the antenna. A discrete surface mounted antenna structure such as a chip antenna based on a ceramic-encapsulated helical antenna structure may be mounted to the printed circuit board. The chip antenna may serve as the antenna's resonating element.

The portable electronic device may have a housing that is formed at least partly from a conductive material such as metal. The conductive housing portion of the portable electronic device is coupled to the ground plane and resonating element portions of the antenna through near-field radio-frequency coupling and forms a parasitic antenna element for the antenna. A resistor may be provided in the wireless communications adapter to electrically connect the ground plane with the conductive housing portion without shorting the conductive housing portion to the ground plane.

Further features of the invention, its nature and various advantages will be more apparent from the accompanying drawings and the following detailed description of the preferred embodiments.

DETAILED DESCRIPTION

Figure 1:
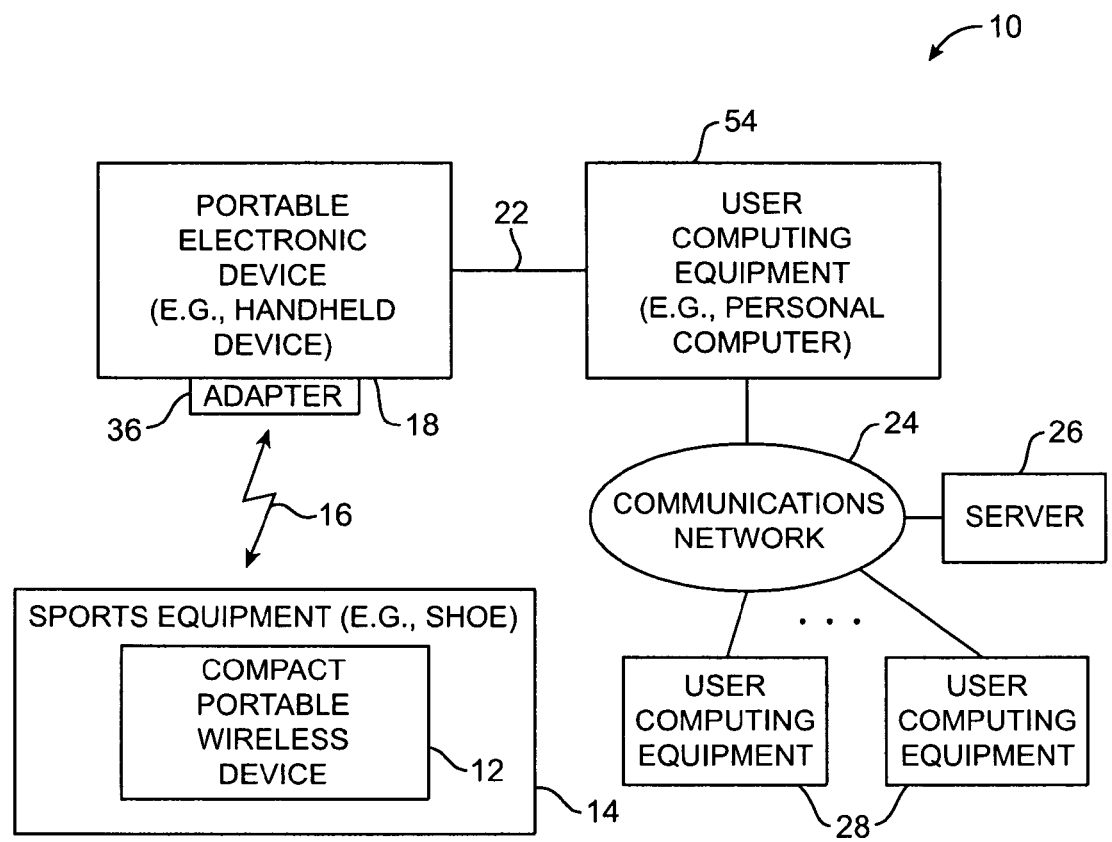
FIG. 1 is a schematic diagram of an illustrative system including a portable electronic device and wireless communications adapter with an antenna in accordance with an embodiment of the present invention.

An illustrative system that contains a portable electronic device with a wireless communications adapter in accordance with an embodiment the present invention is shown in FIG. 1. As shown in FIG. 1, portable electronic device 18 may have wireless communications adapter 36 for communicating with other equipment over wireless communications path 16. In the example of FIG. 1, wireless path 16 forms a communications link to compact portable wireless device 12 in sports equipment 14. This is merely illustrative. Portable electronic device 18 and wireless communications adapter 36 may communicate wirelessly with any suitable electronic equipment. The arrangement in FIG. 1 is presented as an example.

Wireless communications adapter 36 and portable electronic device 18 may contain antenna structures that work together to form an antenna. The antenna supports wireless communications over path 16 and may exhibit a high efficiency and wide bandwidth. Adapter 36 may be used to provide wireless communications capabilities for any suitable electronic device, including personal computers, portable computers, handheld devices, etc. Suitable handheld devices that may use adapter 36 may include cellular telephones, media players with wireless communications capabilities, handheld computers (also sometimes called personal digital assistants), remote controllers, global positioning system (GPS) devices, handheld gaming devices, and hybrid devices that combine the functionality of multiple conventional devices. Examples of hybrid handheld devices include a cellular telephone that includes media player functionality, a gaming device that includes a wireless communications capability, a cellular telephone that includes game and email functions, and a handheld device that receives email, supports mobile telephone calls, and supports web browsing.

Although antennas in accordance with the present invention may be used in any suitable wireless device, it can be particularly advantageous to use the antennas in devices with relatively small form-factors, because the potentially small size occupied by adapter 36 can be advantageous when space is at a premium. Antennas, wireless communications adapters, and electronic devices in accordance with the invention are therefore often described herein in the context of portable electronic devices, such as portable electronic device 18 of FIG. 1.

Portable electronic devices, such as device 18 of FIG. 1, may be portable computers, wrist devices, pendant devices, headphone and earpiece devices, and other wearable and miniature devices. As shown in FIG. 1, device 18 may be a handheld electronic device. With one particularly suitable arrangement, device 18 may be a handheld electronic device that includes media player functionality and that includes circuitry for using adapter 36 to communicate wirelessly with a wireless pedometer module that is installed in the sole of a running shoe (i.e., compact portable wireless pedometer device 12 in shoe 14). Once installed in the running shoe, device 12 can wirelessly communicate with device 18 over link 16. Device 12 may, as an example, gather information on how many steps a runner is taking and may transmit this information to device 18 for processing.

As shown in FIG. 1, compact portable wireless device 12 may communicate with adapter 36 and portable electronic device 18 over wireless communications path 16. Wireless communications path 16 may be a Bluetooth communications path, an IEEE 802.11 wireless communications path (i.e., a WiFi path), a communications path using a custom wireless protocol, or any other suitable wireless communications path. The frequency range covered by path 16 may be about 2.4-2.7 GHz. This is merely illustrative. Path 16 may use any suitable communications band if desired.

The operation of portable electronic device 18 is sometimes described in the context of handheld electronic devices as an example. A handheld electronic device may be, for example, a cellular telephone, a media player with integrated wireless communications capabilities or with wireless communications capabilities that are provided using a plug-in wireless adapter, a handheld computer (personal digital assistant), a remote controller, a global positioning system (GPS) device, a handheld gaming device, or a hybrid device that combines the functionality of two or more such devices. For example, a handheld device may be a hybrid device formed by combining music player and cellular telephone functionality.

Electronic device 18 may communicate with additional electronic equipment. As shown in FIG. 1, electronic device 18 may communicate with user computing equipment 54 over communications link 22. User computing equipment 54 may be any suitable computing equipment including a personal computer, a laptop computer, a handheld computer, a mainframe computer, a workstation, equipment that contains embedded processors, etc. With one suitable arrangement, user computing equipment 54 is a personal computer that has a port that receives portable electronic device 18. The port may be, as an example, a Firewire or universal serial bus port or a dedicated port built into a docking station. When portable electronic device 18 is connected to the port, portable electronic device 18 may gather data from compact portable wireless device 12 and may transfer this data to user computing equipment 54 over communications path 22.

User computing equipment 54 may be connected to server 26 and other user computing equipment 28 over a communications network 24. Communications network 24 may include local area networks, wide area networks such as the internet, or any other suitable communications networks. Server 26 may be implemented using one or more computers at one or more geographic locations. Server 26 may be used to implement a collaborative service that supports athletes or other users who each have a respective compact portable wireless device and a respective handheld electronic device and wireless communications adapter. As an example, server 26 may be used to implement a service in which runners can track their training progress and can compete in virtual competitions with other runners. Compact portable wireless device 12 may be used to gather training data and data for virtual races. During a runner's training run or race, portable electronic device 18 and adapter 36 may wirelessly gather data that is captured using a sensor in compact portable wireless device 12. After the training run or race is complete, the captured data may be downloaded to user computing equipment 54 over communications path 22.

Once the data has been downloaded to user computing equipment 54, a user can use an application running on user computing equipment 54 to process the data (e.g., to track the user's training progress, to compute running speeds throughout a particular run, to compare the data against historical data, etc.). The user can also upload the data from user computing equipment 54 to server 26. Server 26 can use the data that has been uploaded from multiple users. For example, server 26 can compare the performance of two or more runners to determine which runner has won a virtual race. So long as these runners are able to upload the data from their compact portable wireless devices to server 26, server 26 can compare their performance. It is not necessary for the runners to share the same physical location.

Figure 2:
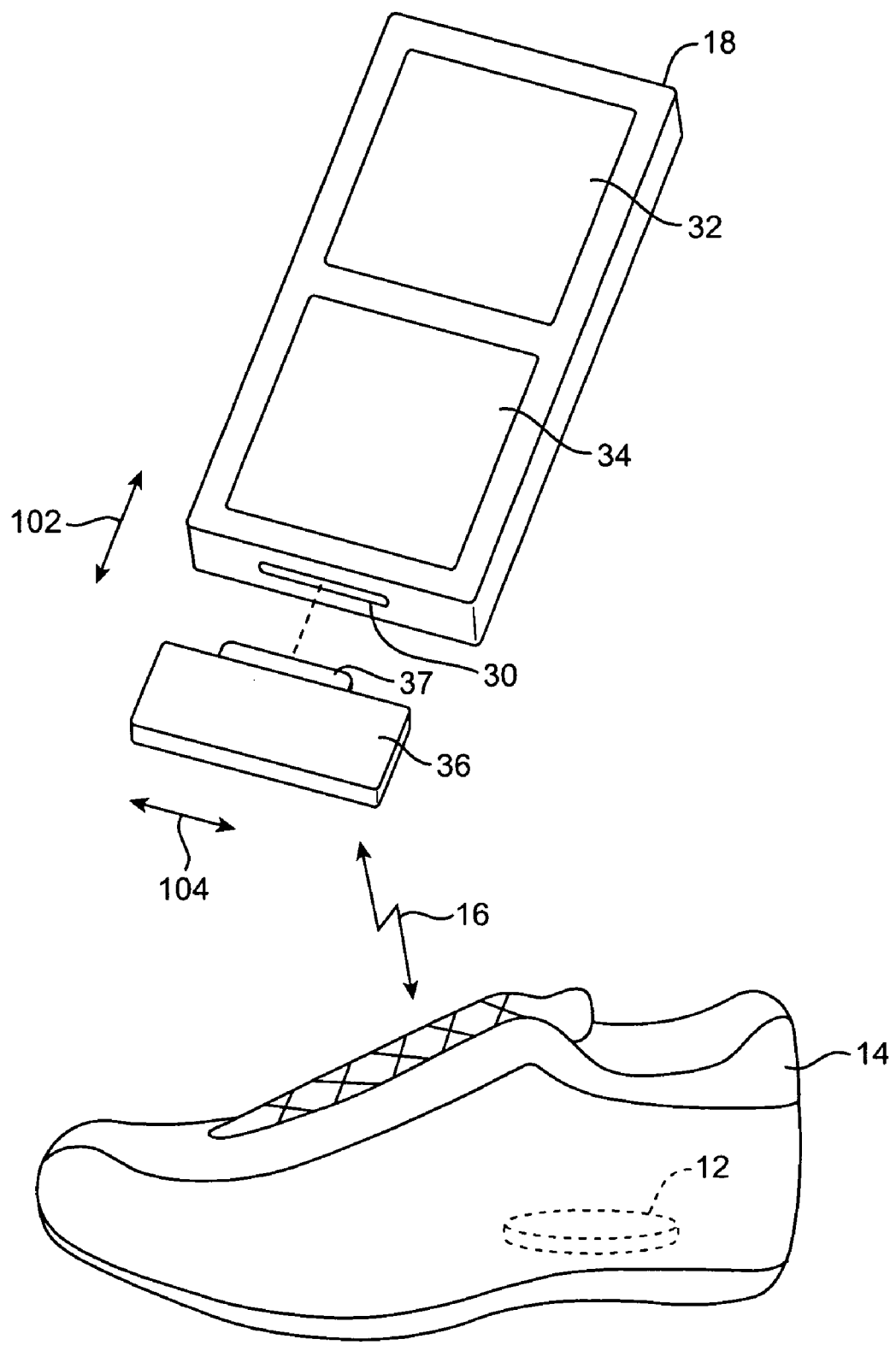
FIG. 2 is a perspective view of an illustrative handheld electronic device with a wireless communications adapter in communication with a compact portable wireless device that has been installed in a running shoe in accordance with an embodiment of the present invention.

FIG. 2 is a perspective view of an illustrative handheld electronic device with a wireless communications adapter in communication with an illustrative compact portable wireless device. As shown in FIG. 2, wireless communications adapter 36 plugs into handheld electronic device 18. Device 18 may be any suitable electronic device, such as a music player, a handheld computer, a cellular telephone, a hybrid device, etc.

Device 18 may have input-output devices such as a display screen 32, user input-output controls 34, and input-output port 30. Display screen 32 may be, for example, a liquid crystal display (LCD), an organic light-emitting diode (OLED) display, a plasma display, or multiple displays that use one or more different display technologies. As shown in the example of FIG. 2, display screens such as display screen 32 can be mounted on a front face of the handheld electronic device. If desired, displays such as display 32 can be mounted on the rear face of the handheld electronic device or on a side or other portion of the device of the device. Visual indicators such as light-emitting diodes (LEDs) may be used instead of or in conjunction with screen 32 to provide visual status information to a user.

A user of handheld device 18 may supply input commands using user input interface 34. User input interface 34 may include buttons (e.g., alphanumeric keys, power on-off, power-on, power-off, and other specialized buttons, etc.), a touch pad, pointing stick, or other cursor control device, a touch screen (e.g., a touch screen implemented as part of screen 32), or any other suitable interface for controlling device 18. Although shown schematically as being formed on the top face of the main unit of handheld electronic device 18 in the example of FIG. 2, user input interface 34 may generally be formed on any suitable portion of handheld electronic device 18. For example, a button or other user interface control may be formed on the side of device 18 or on adapter 36. If desired, device 18 can be controlled remotely (e.g., using an infrared remote control, a radio-frequency remote control such as a Bluetooth remote control, etc.).

Handheld electronic device 18 may have ports such as port 30. Port 30 may be, as an example, a 30-pin electrical connector that mates with corresponding 30-pin electrical connectors on other components (e.g., connectors on cables, docking stations, etc.). As shown in FIG. 2, adapter 36 has connector 37, which mates with connector 30. When adapter 36 is inserted into connector 30, adapter 36 can be used to provide wireless transmit and receive functions for device 18. Adapter 36 may include antenna structures and radio-frequency transceiver circuitry that allow adapter 36 to communicate with compact portable wireless device 12 over communications path 16. Adapter 36 may also include communications circuitry that supports communications between adapter 36 and main unit 38.

In the example of FIG. 2, compact wireless device 12 has been installed in running shoe 14. Compact portable wireless device 12 may be manufactured as part of shoe 14 (or other suitable athletic equipment) or may be installed by a user. A user may, for example, install compact portable wireless device 12 in shoe 14 by lifting the insole of shoe 14 and placing compact portable wireless device 12 in a recess formed within the sole of shoe 14 under the insole.

Figure 3:
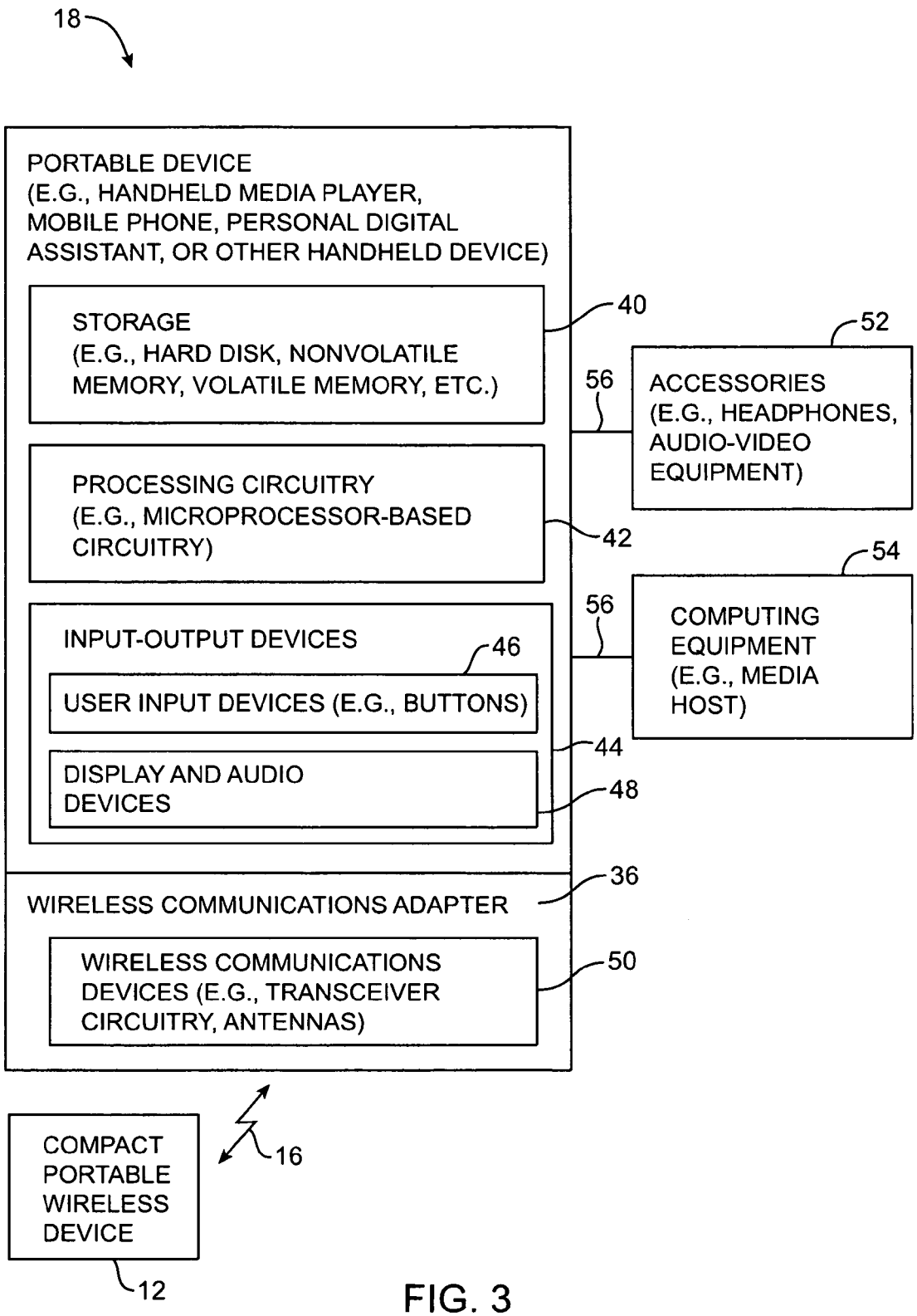
FIG. 3 is a schematic diagram of an illustrative handheld electronic device with a wireless communications adapter in communication with a wireless device, accessories, and computing equipment in accordance with an embodiment of the present invention.

A schematic diagram of handheld electronic device 18 and wireless communications adapter 36 in communication with compact portable wireless device 12 and other devices is shown in FIG. 3. Handheld device 18 may be a mobile telephone, a mobile telephone with media player capabilities, a handheld computer, a remote control, a game player, a global positioning system (GPS) device, a combination of such devices, or any other suitable portable electronic device.

As shown in FIG. 3, handheld device 18 may include storage 40. Storage 40 may include one or more different types of storage such as hard disk drive storage, nonvolatile memory (e.g., flash or other electrically-programmable-read-only memory), volatile memory (e.g., battery-based static or dynamic random-access-memory), etc.

Processing circuitry 42 may be used to control the operation of device 18. Processing circuitry 42 may be based on a processor such as a microprocessor and other suitable integrated circuits. During operation, processing circuitry 42 generates data that may be transmitted as radio-frequency signals through the antenna associated with wireless communications adapter 36 and consumes data that may have been received as radio-frequency signals through the antenna.

Input-output devices 44 may allow data to be supplied to device 18 and may allow data to be provided from device 18 to external devices. Input-output devices can include user input devices 46 such as buttons, touch screens, joysticks, click wheels, scrolling wheels, touch pads, key pads, keyboards, microphones, cameras, etc. A user can control the operation of device 18 by supplying commands through user input devices 46. Display and audio devices 48 may include liquid-crystal display (LCD) screens, light-emitting diodes (LEDs), and other components that present visual information and status data. Display and audio devices 48 may also include audio equipment such as speakers and other devices for creating sound. Display and audio devices 48 may contain audio-video interface equipment such as jacks for external headphones and monitors.

Handheld electronic device 18 and wireless communications adapter 36 may contain communications circuitry that allows handheld electronic device 18 and wireless communications adapter 36 to exchange data through signal pins in connectors 30 and 37 (FIG. 2).

Wireless communications adapter 36 may contain wireless communications devices 50. Wireless communications devices 50 may include communications circuitry such as RF transceiver circuitry formed from one or more integrated circuits, power amplifier circuitry, passive RF components, antennas, and other circuitry for generating and receiving RF wireless signals.

Device 18 can use wireless communications adapter 36 to communicate with compact portable wireless device 12 over wireless communications path 16. Device 18 may also communicate with external devices such as accessories 52 and computing equipment 54, as shown by paths 56. Paths 56 may be wired paths. If desired, device 18 may include internal wireless circuitry or may use adapter 36 to communicate wirelessly over paths 56.

Accessories 52 may include headphones (e.g., a wireless cellular headset or audio headphones) and audio-video equipment (e.g., wireless speakers, a game controller, or other equipment that receives and plays audio and video content). Computing equipment 54 may be a server from which songs, videos, or other media are downloaded over a cellular telephone link or other wireless link. Computing equipment 54 may also be a local host (e.g., a user's own personal computer), from which the user obtains a wireless download of music or other media files.

Figure 4:
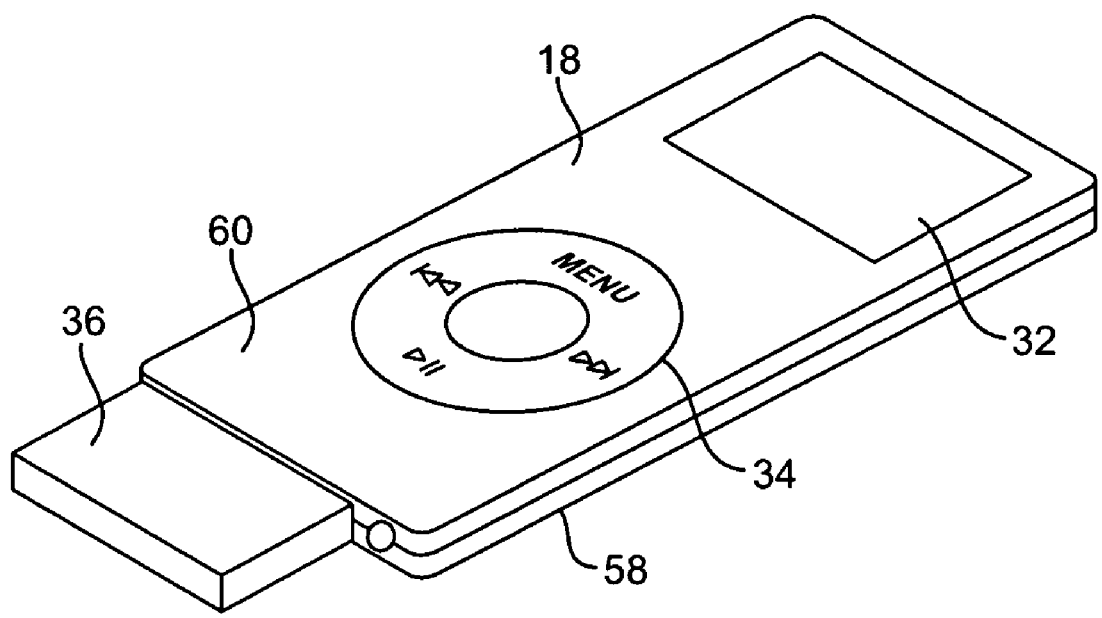
FIG. 4 is a perspective view of an illustrative portable electronic device with a wireless communications adapter in accordance with an embodiment of the present invention.

A perspective view of an embodiment of handheld electronic device 18 is shown in FIG. 4. In the example of FIG. 4, handheld electronic device 18 has been provided with a click-wheel-type user input device for interface 34. The housing of device 18 in the example of FIG. 4 has an upper case portion 60 and a lower case portion 58. Portions 58 and 60 may be formed from any suitable materials, such as plastic or other dielectrics, metal or other conductors, etc. With one suitable arrangement, upper case portion 60 is a plastic cap formed from a plastic based on acrylonitrile-butadiene-styrene copolymers (sometimes referred to as ABS plastic) and lower case portion 58 is based on stamped 304 stainless steel. This is merely illustrative. For example, the housing of device 18 may be formed substantially from plastic or other dielectrics, substantially from metal or other conductors, or from any other suitable material or combinations of materials.

To enhance antenna performance, the antenna structures of wireless communications adapter 36 may make use of a parasitic antenna element in handheld electronic device 18. The parasitic antenna element in handheld electronic device 18 may be formed from any suitable conductive structures in handheld electronic device 18, including battery structures, printed circuit board structures (e.g., a ground plane formed from a planar circuit board ground conductor), and housing structures (e.g., all or part of the housing of device 18, such as upper and/or lower housing portions 58 and 60 of FIG. 4). In general, the parasitic antenna element in handheld electronic device 18 may be formed from any combination of these structures. An arrangement in which the parasitic antenna element in handheld electronic device 18 is formed from a conductive housing portion (some or all of the case) of handheld electronic device 18 is described herein as an example.

Figure 5:
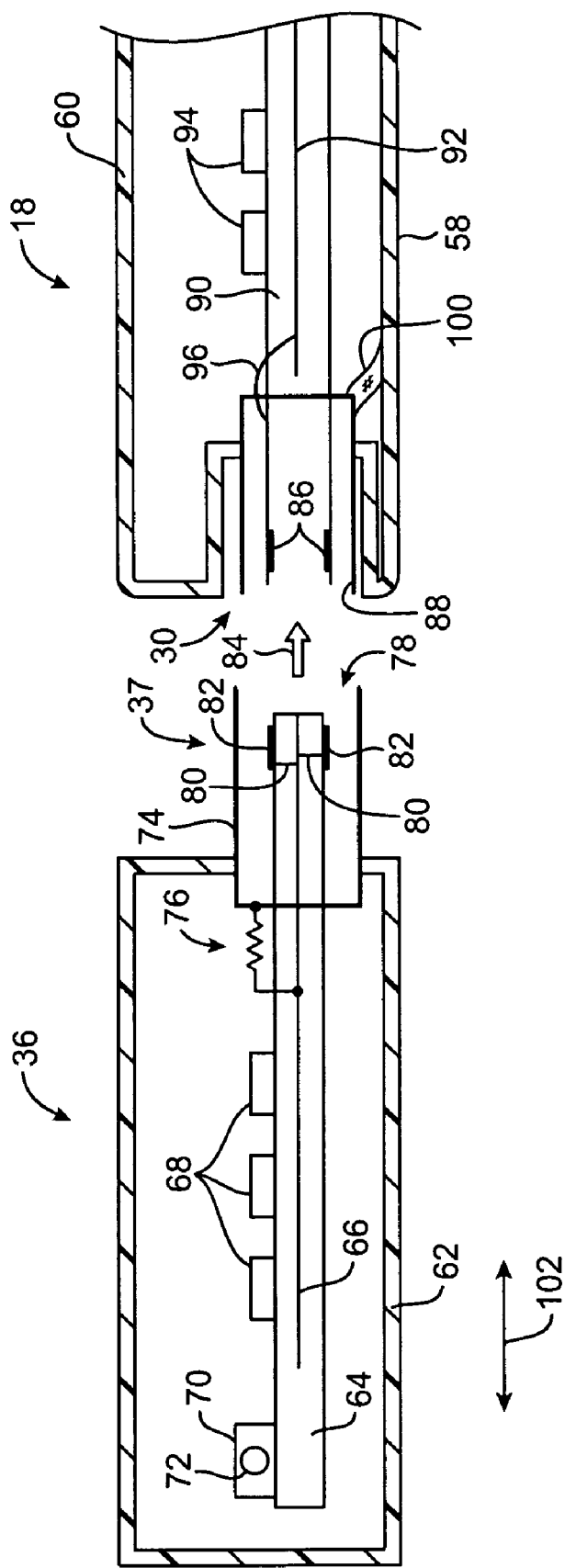
FIG. 5 is a simplified cross-sectional view of an illustrative wireless communications adapter and a portable electronic device in accordance with an embodiment of the present invention.

A cross-sectional side view of an embodiment of an illustrative wireless communications adapter 36 and handheld electronic device 18 is shown in FIG. 5. As shown in FIG. 5, wireless communications adapter 36 may have housing 62. Housing 62 may formed from a plastic such as ABS plastic, other dielectric materials, or any other suitable material. An advantage to forming housing 62 at least partially from a dielectric is that this allows radio-frequency wireless signals to be readily transmitted from and received by the antenna structures within wireless communications adapter 36.

Wireless communications adapter 36 may have printed circuit board 64. Resonating antenna element 70 may be mounted on board 64. Board 64 may contain a planar ground structure such as ground plane 66. Resonating antenna element 70 may be formed from any suitable antenna structure. With one suitable arrangement, resonating element 70 is formed from a discrete surface mount antenna such as a helical chip antenna in which helical antenna structure 72 is surrounded by a ceramic case. An illustrative chip antenna that may be used for resonating element 70 is Panasonic Part No. 5-058, available from Matsushita Electric Industrial Co., Ltd. Resonating element 70, together with ground plane 66 and a parasitic antenna element formed from conductive housing portion 58 of device 18 (and, if desired, a conductive upper housing portion or other suitable conductive structures in handheld electronic device 18) are used to form the antenna for wireless communications adapter 36.

Ground plane 66 may be formed from one or more conductive layers in a multilayer printed circuit board. Other layers in the printed circuit board may be used to form interconnects for interconnecting circuitry such as electrical components 68 that are mounted to printed circuit board 64. Electrical components 68 may include integrated circuits such as a transceiver integrated circuit, a power amplifier integrated circuit, a digital signal processor or microprocessor integrated circuit, and application specific integrated circuits. Electrical components 68 may also include an oscillator crystal and passive components such as capacitors, inductors, and resistors (e.g., components that form an impedance matching network for the antenna). Ground plane 66 may form a ground for the electrical components 68 and may sometimes be referred to as digital ground. Ground pins of electrical components 68 may be electrically connected to ground plane 66 through interconnects formed in printed circuit board 64.

Ground plane 66 may be formed in a portion of printed circuit board 64 that is laterally separated from chip antenna 70 (e.g., by 2 mm or several millimeters or more in lateral dimension 102 and the lateral direction that is into the page of FIG. 5). Providing sufficient separation between chip antenna 70 and ground plane 66 helps to improve antenna efficiency. Good grounding for electrical components 68 may be provided by ensuring that ground plane 66 underlies most or all of the components mounted to board 64.

Signal lines on board 64 are electrically connected to connector pins at end 78 of printed circuit board 63. These connector pins form the active signal paths for connector 37. Shield or shell 74 forms an outer sheath portion for the connector 37. As shown by interconnect paths 80 in FIG. 5, the digital ground formed from ground plane 66 may be electrically connected to some of the connector pins. Any suitable number of connector pins 82 may be connected to ground plane 66. For example, one, two, or three or more pins 82 may be connected to ground plane 66. With one suitable arrangement, there may be 30 pins 82 associated with each of connectors 37 and 30, nine of which are connected to ground plane 66 in adapter 36. Because there are generally multiple pins associated with connectors 37 and 30, connector 37 and mating connector 30 on the handheld electronic device are sometimes referred to as multipin connectors.

Connector shield 74 is sometimes referred to as the chassis ground for wireless communications adapter 36. As shown in FIG. 5, connector shield 74 may be connected to ground plane 66 using resistor 76. Resistor 76 may be, as an example, a 1 kΩ resistor. When connector 37 is inserted into port 30 in direction 84, shield 74 becomes electrically connected to shield 88 of port connector 30. Shield 88 may be electrically connected to conductive housing 58 using metal braid 100 or other suitable conductive path. Metal braid 100 may be connected to shield 88 and housing 58 using conductive adhesive (as an example). Although shields 74 and 88 are electrically connected to each other and to conductive housing portion 58, the presence of resistor 76 ensures that shields 74 and 88 and conductive housing portion 58 are not shorted to ground plane 66.

Conductive housing portion 58 (and shields 74 and 88) form a parasitic antenna element that is near-field radio-frequency coupled with ground plane 66 and chip antenna 70. If the resistance of resistor 76 is extremely low (e.g., 0.1 ohm), shield 74 and ground plane 66 are effectively shorted together. In this situation, housing 58 will generally not perform as a satisfactory parasitic antenna element. Moreover, if the resistance of resistor 76 is too low, the circuitry mounted to board 64 of wireless communications adapter 36 may be susceptible to damage due to electrostatic discharge events (e.g., when a user releases static charge by touching shield 74). It may also be desirable to ensure that the resistance of resistor 76 is not too high, so that the voltage on ground 66 is allowed to equilibrate with the voltage on shield 74 and the chassis ground of handheld electronic device 18 (e.g., the ground of device 18 that is formed from shield 88 and case 58).

Wireless communications adapter 36 may be connected to handheld electronic device 18 by inserting connector 37 into the mating connector 30 on handheld electronic device 18. When inserted, pins 82 on connector 37 mate with corresponding pins 86 on connector 30. At the same time, shield 74 (chassis ground on the wireless communications adapter) mates with shield 88 (chassis ground on handheld electronic device 18).

Handheld electronic device 18 may have printed circuit board 90. Printed circuit board 90 may lie in the same or substantially same plane as printed circuit board 64 and ground plane 66 (i.e., printed circuit board 64 and its structures may be coplanar with printed circuit board 90 and its structures). Integrated circuits and other electrical components 94 may be mounted to circuit board 90. Circuit board 90 may have one or more conductive layers that are patterned to form ground plane 92. Ground plane 92 may form a ground for printed circuit board 90 and may be referred to as the digital ground of handheld electronic device 18. Ground plane 92 may be connected to at least some of the pins 86 on connector 30, as indicated schematically by conductive path 96. This allows the digital grounds on the wireless communications adapter 36 and handheld electronic device 18 to equilibrate during operation.

When wireless communications adapter 36 is connected to handheld electronic device 18, the electrical structure formed by shields 74 and 88 and the conductive portion of the handheld electronic device housing form a parasitic antenna element for the antenna of wireless communications adapter 36 that improves antenna performance. The case of the handheld device (with and without shields 74 and 88 of connectors 37 and 30) may therefore sometimes be referred to as the antenna's parasitic element or ground extension. In operation, the parasitic element formed by conductive portions of the handheld electronic device housing such as conductive housing portion 58 is near-field coupled to ground plane 66, without being electrically shorted to ground plane 66, which helps to enhance the efficiency and broaden the bandwidth of the antenna.

For satisfactory antenna operation, the dimensions of ground plane 66 and the parasitic antenna element formed from the housing should have appropriate sizes and should be placed at appropriate spatial locations relative to each other. In a typical scenario, the ground plane 66 is a planar structure that is laterally spaced at least several millimeters from chip antenna 70 (i.e., the closest edge of ground plane 66 is separated from the closest portion of chip antenna 70 by several millimeters in a first lateral dimension that is oriented into the page of FIG. 5 and in a second lateral dimension that is oriented along the page of FIG. 5 in direction 102).

Link 16 of FIG. 1 may be formed using any suitable communications frequency band. With one suitable arrangement, link 16 may be a 2.4 GHz link, such as a Bluetooth® or IEEE 802.11 link (WiFi) or a custom link in the same general frequency range (e.g., a frequency range of about 2.4-2.7 GHz). In these types of situations, the free space wavelength of the radio-frequency signals that are being conveyed between wireless communications adapter 36 and other equipment over link 16 will be about 12 cm. When radio-frequency signals are in relatively close proximity to handheld device 18 and structures such as printed circuit board 64 of wireless communications adapter 36, the size of one wavelength is reduced by a factor approximately equal to the square root of the effective dielectric constant (i.e., by about 20-40% for common printed circuit board materials). As a result, one wavelength ($\lambda$) at 2.4 GHz becomes about 8-9 cm (approximately).

The lateral dimensions of the antenna structures (i.e., the width of the structures in dimension 104 of FIG. 2 and the length of the structures in dimension 102 of FIG. 2) has an impact on antenna performance. It has been determined that antenna performance may be improved significantly (e.g., by 20% to 40%) when the parasitic antenna element has lateral dimensions on the order of about $\lambda/4$ to $\lambda/2$ (i.e., about 1.5 cm, 2 cm, 3 cm, 4 cm, 5 cm, 6 cm or other suitable lateral dimension) or at least less than about $\lambda$ (e.g., less than about 9 cm, 10 cm, 11 cm, 12 cm or other suitable lateral dimension) and has a total length plus width (L+W) of less than or equal to about $\lambda$ (e.g., less than about 9 cm, 10 cm, 11 cm, 12 cm, or other suitable amount). When these optimum size guidelines are not followed, antenna performance may be increased to a lesser extent or may not be substantially increased by the presence of the parasitic antenna element.

Ground plane 66 may have lateral dimensions as large as about $\lambda$. Because it is generally desirable to minimize the size of external adapters such as wireless communications adapter 36, it may be advantageous to reduce the size of ground plane 66 (e.g., so that ground plane 66 has lateral dimensions on the order of $\lambda/4$). As the performance of antennas may decrease with decreasing size, the improved performance that is provided by the parasitic element formed from the housing of handheld electronic device 18 can be particularly advantageous in situations such as these in which minimal component size is desired.

Figure 6:
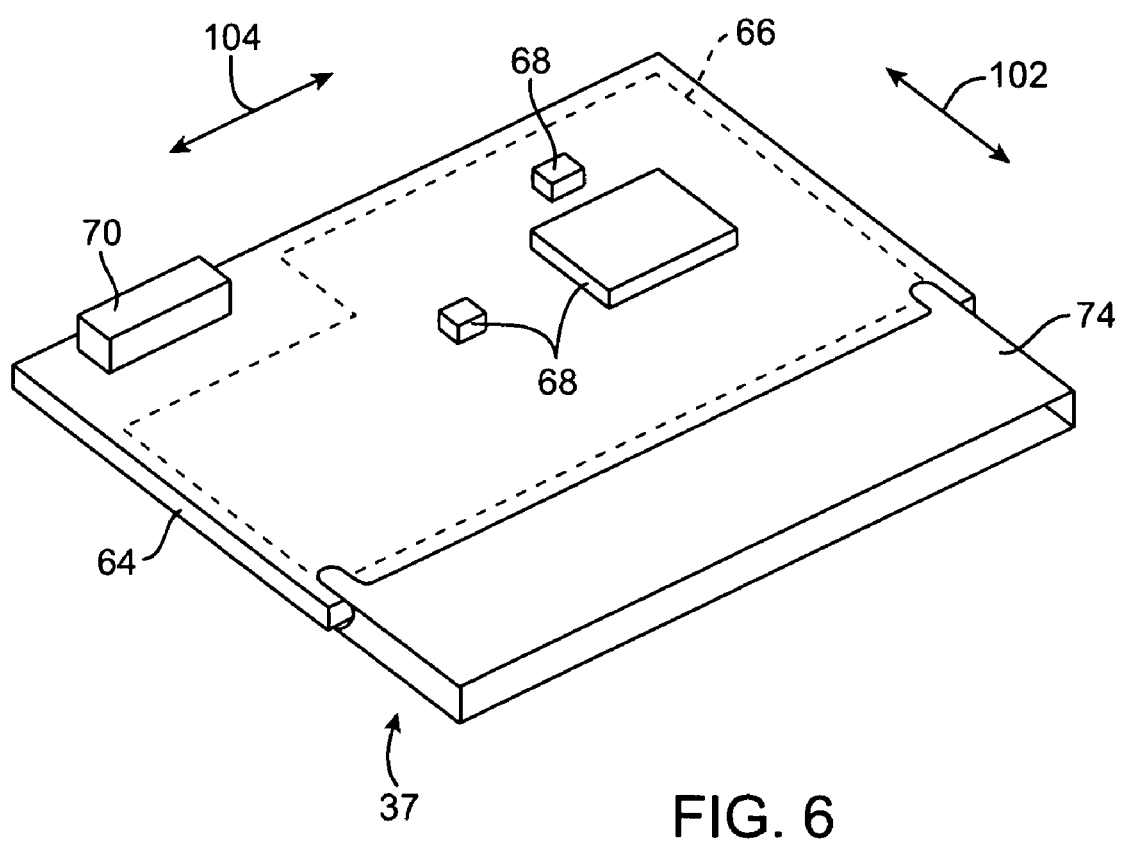
FIG. 6 is a perspective view of an interior portion of a wireless communications adapter in accordance with an embodiment of the present invention.

Ground plane 66 need not be rectangular. A perspective view of an illustrative printed circuit board 64 having a non-rectangular planar ground structure 66 is shown in FIG. 6. In the example of FIG. 6, the shape and position of ground plane 66 is indicated by the dotted line. As shown in FIG. 6, there is generally a clearance (e.g., a clearance of about 2-5 mm or more) between the closest edges of ground plane 66 and chip antenna 70. This separation is desirable for optimum operation of the antenna. Electrical components 68 (e.g., a radio-frequency transceiver integrated circuit and passive components for impedance matching, etc.) may be mounted on board 64 above ground plane 66. Shield portion 74 of connector 37 forms chassis ground and may be mounted to printed circuit board 64 using any suitable technique (e.g., with a plastic mounting structure, by crimping portions of shield 74 to the protruding edge of board 64, using adhesive, etc.)

Figure 7:
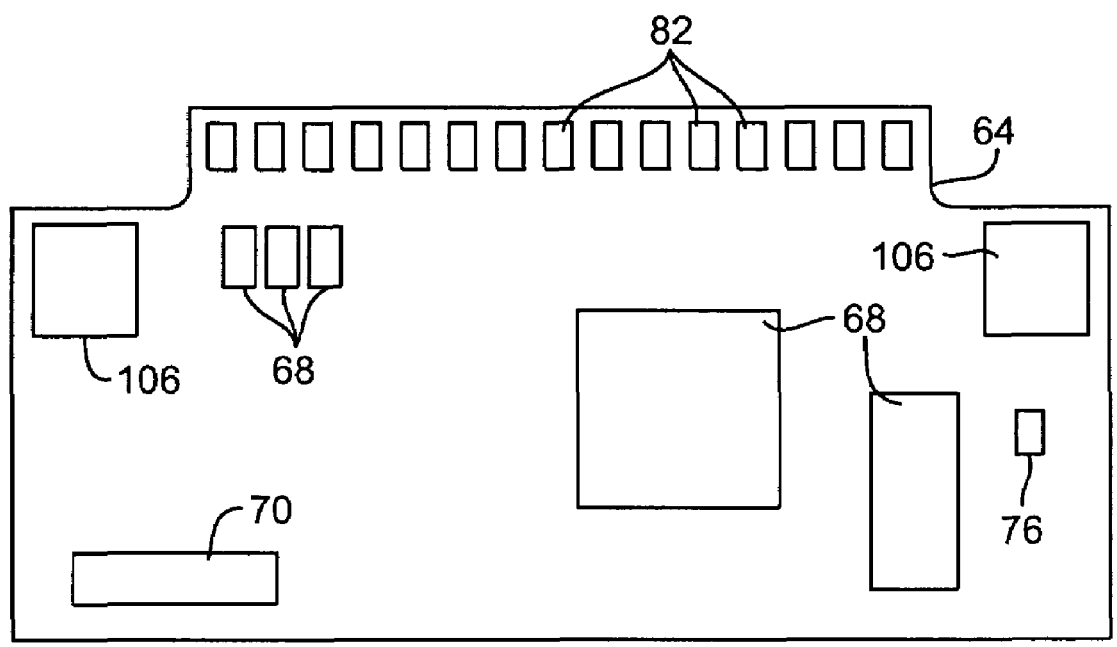
FIG. 7 is a plan view of a printed circuit board and associated components for a wireless communications adapter in accordance with an embodiment of the present invention.

A top view of an illustrative embodiment of printed circuit board 66 is shown in FIG. 7. In the configuration shown in FIG. 7, shield 74 of connector 37 has not yet been mounted to board 66. As a result, a top set of 15 pins 82 is visible (15 identical pins 82 on the lower side of printed circuit board 66 are not visible). Resistor 76 may be mounted on board 64 in the location shown in FIG. 7 or any other suitable location. As shown in FIG. 7, conductive tab structures 106 on board 64 may be used to form electrical contact to shield 74 (FIG. 6). As described in connection with FIG. 5, resistor 76 is preferably used to electrically connect the chassis ground of adapter 36 (i.e., tabs 106 and shield 74 of connector 37) to digital ground (ground plane 66).

The foregoing is merely illustrative of the principles of this invention and various modifications can be made by those skilled in the art without departing from the scope and spirit of the invention.

What is claimed is:

1. An antenna associated with a wireless communications adapter for a portable electronic device, wherein the antenna is formed partly using a conductive structure in the portable electronic device that serves as a parasitic antenna element, the antenna comprising:
    a discrete surface mount antenna structure in the wireless communication adapter that forms a resonating element for the antenna;
    a printed circuit board ground plane in the wireless communications adapter that forms an antenna ground for the antenna, wherein the discrete surface mount antenna structure is mounted to the printed circuit board; and
    a resistor that electrically connects the ground plane and the conductive structure in the portable electronic device that serves as the parasitic antenna element.

2. The antenna defined in claim 1 wherein the discrete surface mount antenna comprises a helical chip antenna.

3. The antenna defined in claim 1 wherein the conductive structure comprises a conductive handheld electronic device housing and a portion of at least one multipin connector.

4. The antenna defined in claim 1 wherein the portable electronic device comprises a handheld electronic device having a housing, wherein the discrete surface mount antenna structure comprises a chip antenna, and wherein the conducting structure comprises at least a conductive portion of the housing of the handheld electronic device.

5. An antenna that is associated with a handheld electronic device and a separate wireless communications adapter that is mounted to the handheld electronic device, the antenna comprising:
- an antenna structure in the wireless communication adapter that forms a resonating element for the antenna;
- a ground plane in the wireless communications adapter that forms an antenna ground for the antenna; and
- a conductive handheld electronic device housing portion of the handheld electronic device that forms a parasitic antenna element for the antenna.

6. The antenna defined in claim 5, wherein the wireless communications adapter and handheld electronic devices each comprise a respective mating multipin connector, the antenna further comprising:
- metal shield portions formed from the multipin connectors that are electrically connected to the conductive handheld electronic device housing portion and that form part of the parasitic antenna element, wherein the metal shield portions are not shorted to the ground plane.

7. The antenna defined in claim 5 further comprising a resistor that is electrically connected between the ground plane in the wireless communications adapter and the conductive handheld electronic device housing portion.

8. Electronic equipment comprising:
- a handheld electronic device comprising:
  - processing circuitry that generates and consumes data; and
  - a conductive housing portion that forms a parasitic antenna element;
  - a handheld electronic device connector having a shield that is electrically connected to the conductive housing portion; and
- a wireless communications adapter that is mounted to the handheld electronic device, comprising:
  - a printed circuit board;
  - a wireless communications connector that is mounted to the printed circuit board and that has a shield that is electrically connected to the handheld electronic device connector;
  - an antenna ground plane formed on the printed circuit board;
  - a resonating antenna element mounted to the printed circuit board, wherein the resonating antenna element, the antenna ground plane, and the parasitic antenna element form an antenna for the wireless communications adapter; and
  - a radio-frequency transceiver mounted to the printed circuit board that transmits and receives the data as radio-frequency signals through the antenna.

9. The electronic equipment defined in claim 8 wherein the handheld electronic device comprises a device with music player functionality and wherein the conductive housing portion comprises metal.

10. The electronic equipment defined in claim 8 wherein the ground plane is formed from at least one metal layer within the printed circuit board and is spaced at least 2 mm from the resonating antenna element and wherein the resonating element comprises a chip antenna.

11. The electronic equipment defined in claim 8 further comprising:
- a resistor that is mounted to the circuit board and that is electrically connected between the antenna ground plane and the shield of the wireless communications adapter connector.

12. The electronic equipment defined in claim 8 wherein the handheld electronic device connector and the wireless communications adapter connector comprise mating pins.

13. The electronic equipment defined in claim 8 wherein the handheld electronic device connector and the wireless communications adapter connector comprise mating pins, the handheld electronic device further comprising a printed circuit board comprising a digital ground, wherein at least one of the pins electrically connects the ground plane in the wireless communications adapter to the digital ground of the handheld electronic device.

14. The electronic equipment defined in claim 8 wherein the handheld electronic device connector comprises a first plurality of pins, wherein the wireless communications adapter connector comprises a second plurality of pins, wherein the shield of the wireless communications adapter connector mates with the shield of the handheld electronic device connector and is electrically connected to the shield of the handheld electronic device connector, and wherein the first pins mate with the second pins, the handheld electronic device further comprising a printed circuit board comprising a digital ground, wherein at least one of the first pins and at least one of the second pins electrically connect the ground plane in the wireless communications adapter to the digital ground of the handheld electronic device.

15. The electronic equipment defined in claim 8 wherein the shield of the handheld electronic device connector comprises a first metal shield, wherein the handheld electronic device connector comprises a first plurality of pins, wherein the shield of the wireless communications adapter connector comprises a second metal shield, wherein the wireless communications adapter connector comprises a second plurality of pins, wherein the first metal shield mates with the second metal shield and is electrically connected to the second metal shield, and wherein the first pins mate with the second pins, the handheld electronic device further comprising a printed circuit board comprising a digital ground, wherein at least one of the first pins and at least one of the second pins electrically connect the ground plane in the wireless communications adapter to the digital ground of the handheld electronic device, and wherein the printed circuit board in the wireless communications adapter and the printed circuit board in the handheld electronic device are coplanar.

16. The electronic equipment defined in claim 8 wherein the shield of the handheld electronic device connector comprises a first metal shield, wherein the handheld electronic device connector comprises a first plurality of pins, wherein the shield of the wireless communications adapter connector comprises a second metal shield, wherein the wireless communications adapter connector comprises a second plurality of pins, wherein the first metal shield mates with the second metal shield and is electrically connected to the second metal shield, and wherein the first pins mate with the second pins, the handheld electronic device further comprising a printed circuit board comprising a digital ground, wherein at least one of the first pins and at least one of the second pins electrically connect the ground plane in the wireless communications adapter to the digital ground of the handheld electronic device, and wherein the wireless communications adapter wirelessly communicates with a compact portable wireless device in a shoe over a communications link operating in a frequency range of 2.4-2.7 GHz, the antenna being configured to transmit and receive radio-frequency signals in the frequency range of 2.4-2.7 GHz.

17. The electronic equipment defined in claim 8 wherein the handheld electronic device comprises a display and a user input interface.

18. The electronic equipment defined in claim 8 wherein the handheld electronic device has lateral dimensions that are less than about 11 cm and wherein the conductive housing portion comprises metal.

19. The electronic equipment defined in claim 8 wherein the handheld electronic device has lateral dimensions in the range of 2 cm to 12 cm and wherein the conductive housing portion comprises metal.

20. The electronic equipment defined in claim 8 wherein the handheld electronic device connector and the wireless communications adapter connector are each 30 pin connectors having 30 pins for conveying data and ground signals.

* * * * *